(12) United States Patent
Dey et al.

(10) Patent No.: US 11,289,857 B2
(45) Date of Patent: Mar. 29, 2022

(54) ELECTRICAL CONNECTOR WITH INTEGRATED CURRENT SENSOR

(71) Applicant: HEWLETT PACKARD ENTERPRISE DEVELOPMENT LP, Houston, TX (US)

(72) Inventors: Nilashis Dey, Houston, TX (US); Vincent W. Michna, Houston, TX (US); Patrick Raymond, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 178 days.

(21) Appl. No.: 16/368,809

(22) Filed: Mar. 28, 2019

(65) Prior Publication Data

US 2020/0313365 A1    Oct. 1, 2020

(51) Int. Cl.
*H01R 13/66* (2006.01)
*H02H 7/20* (2006.01)
(Continued)

(52) U.S. Cl.
CPC ......... *H01R 13/6683* (2013.01); *G01R 31/40* (2013.01); *H01R 13/7175* (2013.01);
(Continued)

(58) Field of Classification Search
CPC .. H01R 13/6683; G01R 31/40; H02H 1/0007; H02H 7/20
See application file for complete search history.

(56) References Cited

U.S. PATENT DOCUMENTS 5,583,429 A * 12/1996 Otaka ................. G01R 15/202
324/117 H
7,294,995 B1   11/2007 Stevens et al.
(Continued)

FOREIGN PATENT DOCUMENTS

EP          3384297 A1   10/2018
WO    2017/093792 A1    6/2017

OTHER PUBLICATIONS

Ginart et al., "On-line Intermittent Connector Anomaly Detection", IEEE Autotestcon, 2011, 5 pages.

*Primary Examiner* — Scott Bauer
(74) *Attorney, Agent, or Firm* — Hewlett Packard Enterprise Patent Department

(57) ABSTRACT

An example electrical connector includes a magnetic core embedded in the overmold and encircling conductive paths therein and a Hall-effect sensor embedded in the overmold and configured to sense a magnetic field of the magnetic core. The Hall-effect sensor generates an output that indicates whether or not the supply current flowing through the connector matches the return current flowing through the connector, and this output may be used to detect stray-current faults in which current bypasses the connector to return via alternative paths such as through a device chassis. The connector may include one or more supply wires embedded in the overmold, one or more return wires embedded in the overmold, one or more supply terminals embedded in the overmold and terminating the supply wires, and one or more return terminals embedded in the overmold and terminating the return wires. The magnetic core embedded in the overmold may encircle (a) the supply terminals or the supply wires or both, and (b) the return terminals or the return wires or both.

14 Claims, 12 Drawing Sheets

(51) Int. Cl.
*H01R 13/717* (2006.01)
*H02H 1/00* (2006.01)
*G01R 31/40* (2020.01)
*H01R 13/50* (2006.01)

(52) U.S. Cl.
CPC .......... *H02H 1/0007* (2013.01); *H02H 7/20* (2013.01); *H01R 13/50* (2013.01)

(56) References Cited

U.S. PATENT DOCUMENTS

| | | |
|---|---|---|
| 7,659,709 B2 | 2/2010 | Lepine et al. |
| 9,423,469 B2 | 8/2016 | Gudel et al. |
| 9,720,044 B2 | 8/2017 | Mills et al. |
| 9,774,149 B2 | 9/2017 | Janfada et al. |
| 9,804,202 B2 | 10/2017 | Labbe |
| 10,090,618 B2 | 10/2018 | Rohrbach et al. |
| 2005/0103613 A1* | 5/2005 | Miller .................... H01H 71/04 200/400 |
| 2011/0149447 A1* | 6/2011 | Fink .................... H02H 3/33 361/45 |
| 2017/0010310 A1 | 1/2017 | Morel et al. |

* cited by examiner

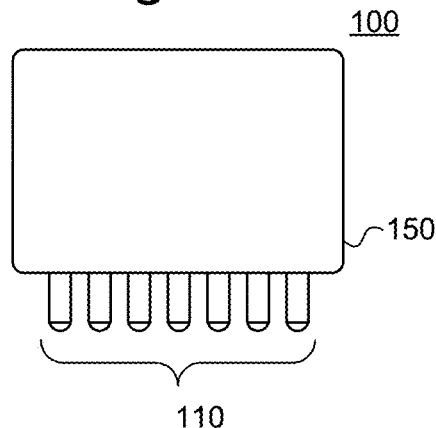
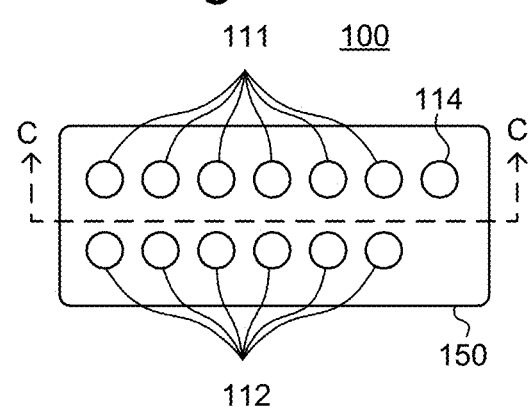
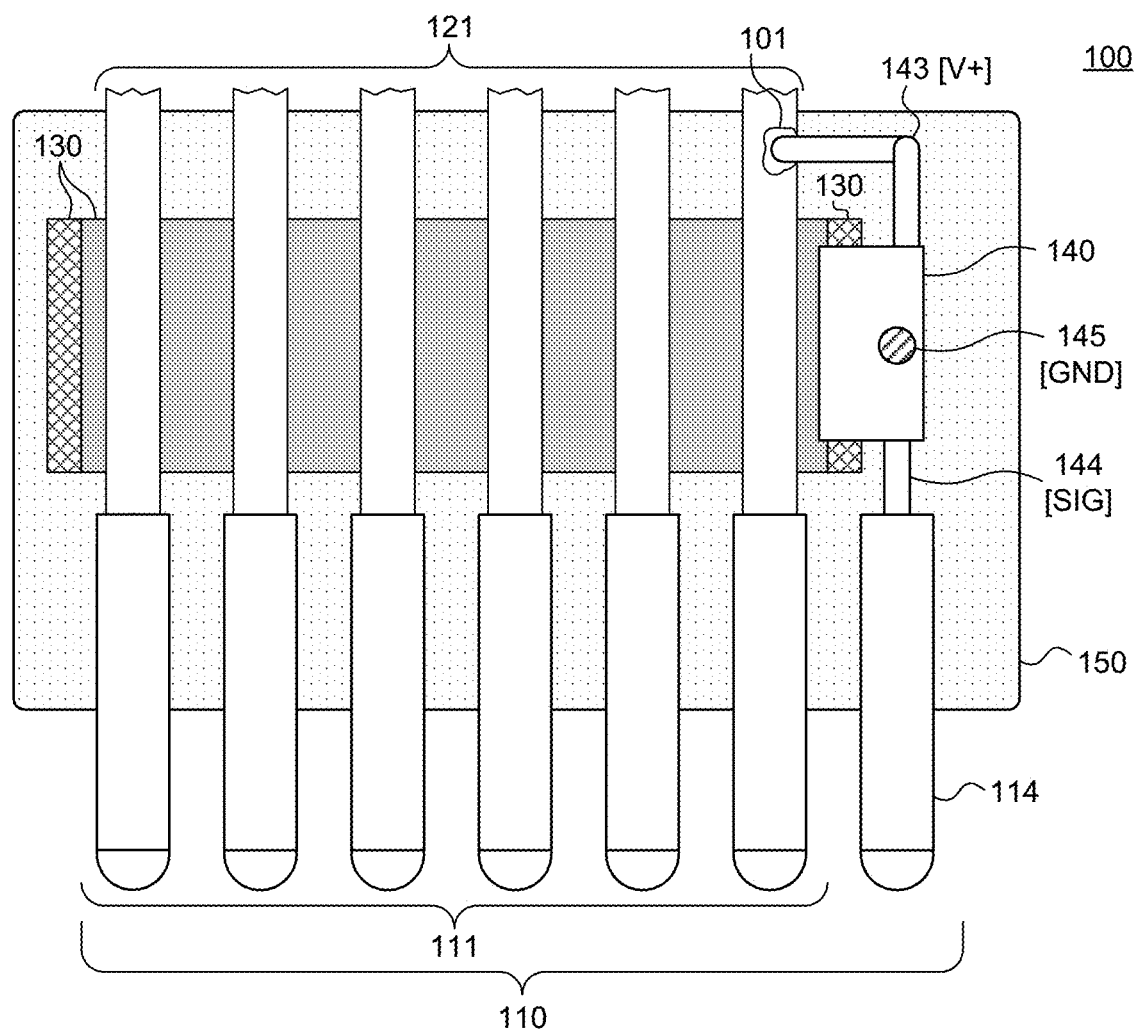

ELECTRICAL CONNECTOR WITH INTEGRATED CURRENT SENSOR

BACKGROUND

Electronic devices, such as a servers or other information technology (IT) equipment, are electrically connected to other devices and/or to power sources via electrical connectors. Electrical connectors enable two sets of wires to be electrically connected together ("wires" being used broadly herein to mean any electrically conductive path, including conductive traces on printed circuit boards). Specifically, when one electrical connector that terminates a first set of wires (e.g., wires in a power cord) is connected to (plugged into) a second electrical connector that terminates a second set of wires (e.g., wires in a printed circuit board), the mating of the two connectors establishes electrical connections between the first and second sets of wires. The electrical connectors include terminals (e.g., pins, sockets) to establish the electrical connections between the wires. A terminal terminates a wire and is configured to mate with a complementary terminal of another electrical connector when their electrical connectors are connected together. When the two complementary terminals mate, physical contact is made between conductive portions of each of the terminals, which establishes an electrical connection between the respective wires that are terminated by the terminals.

BRIEF DESCRIPTION OF THE DRAWINGS

FIG. 4A illustrates a modified version of the example smart electrical connector of FIG. 2A, in which power for the Hall-effect sensor is obtained from the wires 121 and thus terminals 110 to power the sensor are omitted.

FIG. 4B illustrates a front view of the smart electrical connector of FIG. 4A.

FIG. 4C illustrates a cross-sectional view of the smart electrical connector of FIG. 4A, with the section being taken along the line C-C.

DETAILED DESCRIPTION

Electrical systems, such as servers, may be susceptible to electrical faults that can degrade performance, damage the system, and/or pose a safety risk to users. One example of such a fault involves some of the current that is supplied to a device returning to the power source through an unintended path. For example, such faults may involve return current bypassing the return wirings of an electrical connector through which the current is supposed to return, and instead returning to the power source by traveling through some other path such as through the chassis of the device. Such faults may cause damage, and may also pose a safety risk to users.

Thus, smart electrical connector are described herein that may be able to detect such faults, enabling countermeasures to be taken to reduce the risk of damage to equipment or persons. Example smart electrical connectors described herein embed a magnetic core and a Hall-effect sensor in the overmold of the electrical connector. The magnetic core surrounds the supply and return wires of the connector, except for a gap in which the Hall-effect sensor is positioned so as to sense magnetic fields induced in the magnetic core (see FIG. 1B). The Hall-effect sensor outputs a signal indicative of a magnitude of the magnetic field induced in the magnetic core.

The output signal of the Hall-effect sensor of such a smart electrical connector can then be used to determine whether one of the faults noted above has occurred. In particular, because the magnetic core surrounds the wires of the connector, current flowing through the wires will induce magnetic fields in the magnetic core. However, because the current flows in opposite directions in the supply and return wires, if the amount of current flowing through the supply wires of the connector ("supply current") and the amount of current flowing through the return wires of the connector ("return current") are equal, then the magnetic fields induced by the wires will cancel one another out resulting in approximately zero total magnetic field in the magnetic core. In contrast, if the supply current and return current are not balanced (equal), then the magnetic fields induced by the wires will not fully cancel one another out and there will be some non-zero total magnetic field in the magnetic core.

Figure 1A:
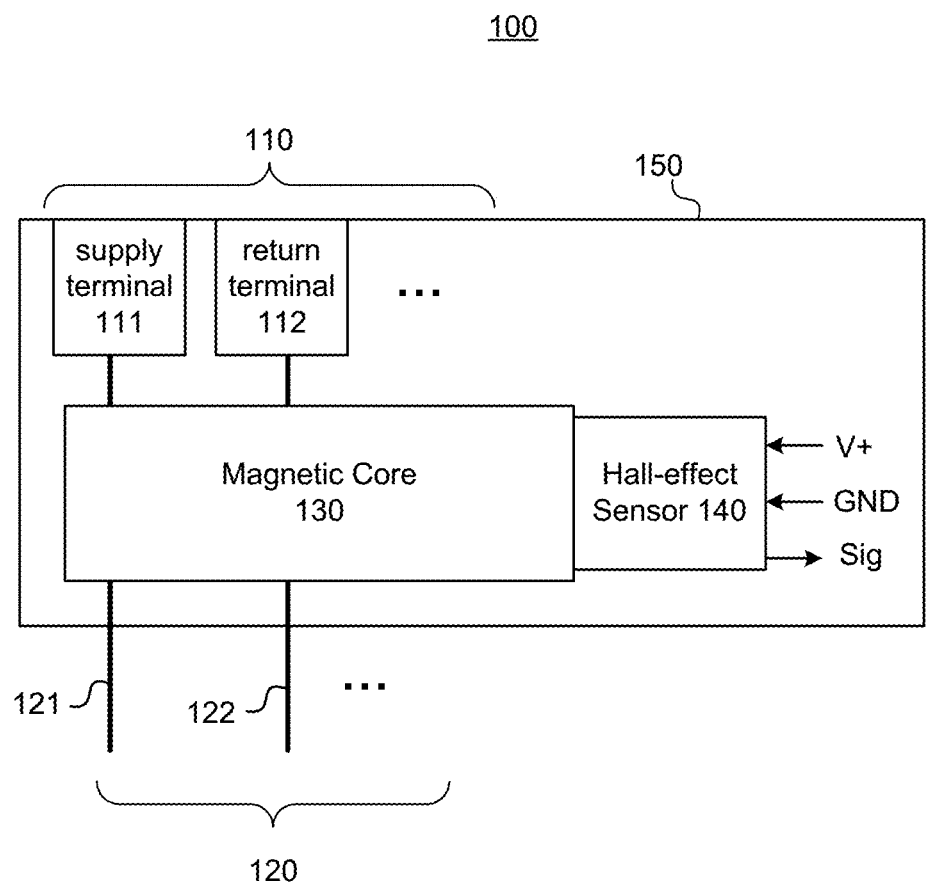
FIG. 1A is a block diagram illustrating conceptually an example smart electrical connector with integrated Hall-effect sensor.
Figure 1B:
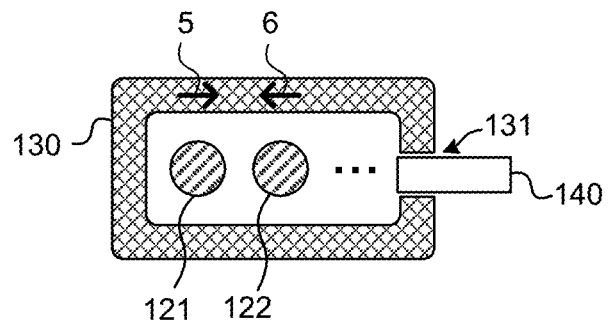
FIG. 1B illustrates a cross-sectional view of an example magnetic core encircling wires with a sensor in a gap of the core.

For example, in FIG. 1B, the supply wire 121 induces a field 5 in the magnetic core 130, and the return wire 122 induces a field 6 in the core 130. The fields point in opposite directions because the supply and return currents flow in opposite directions, and therefore if the magnitude of the fields 5 and 6 is the same (because the supply and return currents are the equal), they cancel each other out for a net total field of zero. However, if the currents flowing through the wires 121 and 122 are not equal, then the magnitude of the fields 5 and 6 will not be equal, and the net magnetic field in the core 130 will be non-zero.

Thus, the output signal of the Hall-effect sensor indicates whether or not the supply current is equal to the return current. Because a fault of the type noted above involves some of the current bypassing the connector and returning through other paths, when such a fault occurs the supply current and the return current will not be balanced, and therefore the output signal of the Hall-effect sensor will indicate a non-zero field. When no fault is present, the supply current and return current should be equal, and thus the output signal of the Hall-effect sensor will indicate zero field. Accordingly, the output signal of the Hall-effect sensor may be monitored to determine whether or not a fault of the stray-current type has occurred.

In some examples, the output of the Hall-effect sensor is sent to fault detection logic on the device powered by the smart electrical connector, which monitories for faults based on the output. For example, a pin of the electrical connector may be used to communicate the output signal of the Hall-effect sensor to the fault detection logic.

An advantage of having the fault detection system (core and sensor) embedded within the connector, rather than provided as a separate device somewhere else in the circuit, is that an accuracy of the fault detection system may be increased. In particular, the further the measurement point is from the current source/return points (i.e., the connector terminals), the more likely it is that something may reduce the accuracy of the fault detection. For example, if return current is straying from the desired return path at a location somewhere between the fault detection system and the return terminals, then the fault detection system may not detect the fault. By embedding the fault detection system directly in the connector, the distance between fault detection system and terminal is reduced (or even eliminated), and therefore the likelihood of the fault point occurring between the fault detection system and the return terminals is greatly reduced, and therefore the likelihood of the fault being missed is reduced.

Another advantage of locating the fault detection system within the electrical connector itself, as opposed to somewhere else on the PCB, is that in some examples scarce and valuable PCB space may be saved. In some examples, the cost of redesigning electrical connectors is relatively low and it is relatively easy to find or create space for the fault detection system within the connector. In contrast, it costs relatively a lot to redesign a PCB to add a fault detection system to it, and the space on a PCB is generally relatively expensive.

Detailed examples of the aforementioned techniques and devices will now be described with reference to the Figures.

1. Example Smart Electrical Connector

FIG. 1 conceptually illustrates an example smart electrical connector 100 (also referred to as a "connector 100" or "smart connector 100"). Various features of the smart electrical connector 100 could be implemented in a variety of ways, and some of these different implementation examples are illustrated in greater detail in FIGS. 2-8. Examples of the connector 100 may include every combination and permutation of the features described in relation to FIGS. 2-8 (except mutually exclusive features), but to simplify the description not every such combination/permutation is illustrated. The smart connector 100 will be described generally in relation to FIG. 1, with reference to the more detailed examples of FIGS. 2-8 as needed.

As illustrated in FIG. 1A, the connector 100 includes at least two terminals 110 terminating at least two wires 120. The connector 100 also includes a magnetic core 130 that encircles (surrounds, encompasses) the wires 120, the terminals 110 that terminate the wires 120, or both (see, for example, FIG. 1B). The connector also includes a Hall-effect sensor 140 (also referred to as "sensor 140") that is configured to sense a magnetic field of the magnetic core 130, such that an output signal of the sensor 130, denoted SIG, is indicative of the strength of the magnetic field. The wires 120 and terminals 110 are at least partially embedded within a non-conductive (e.g., plastic) overmold 150 (see, for example, FIGS. 3A and 3B). The magnetic core 130 and the sensor 140 are also embedded within the overmold 150 (see, for example, FIGS. 3A and 3B).

The smart connector 100 could be used in any (or all) of the electrical connectors that are used to electrical connect two devices together. For example, in a common scenario, a first device will have an electrical connector, which is mated with a first connector of an intermediary, such as a cable assembly or backplane, which is connected via wires to a second connector of the intermediary, which is mated with a connector of a second device. The smart connector 100 could be implemented as any or all of these connectors.

The smart connector 100 is configured such that, when the supply current flowing through the wires 120 equals the return current flowing through the wires 120, the output signal SIG of the sensor 140 is in a first range of values (corresponding to there being zero or negligible magnetic field), while when the supply current flowing through the wires 120 does not equal the return current flowing through the wires 120, the output signal SIG of the sensor 140 is in a second range (corresponding to there being some non-negligible magnetic field). As described above, the supply current and return current being unbalanced corresponds to a stray current fault, and therefore the output signal SIG may be monitored to detect such faults. In particular, a fault may be identified responsive to the signal SIG taking on a value within the second range of values. Corrective measures may then be taken, such as shutting down a power supply, signaling a user, etc.

As noted above, the magnetic core 130 encircles (surrounds, encompasses) each of the wires 120 (see FIG. 1B), each of the terminals 110 that terminates one of the wires 120, or both. More specifically, the magnetic core 130 should encircle each of the conductive paths that carries supply current or return current through the connector 100 (excluding, in some examples, conductive paths for powering or providing signaling connections to the sensor 140), and the location at which the core encircles the conductive paths can be a location at which it overlaps just the wires 120, a location at which it overlaps just the terminals 110, or at a location at which it overlaps both the wires 120 and the terminals 110. Moreover, as used herein, the magnetic core 130 "encircling" something means that the core 130 extends all the way around the encircled object on all sides thereof within a plane (such as how a ring would encircle a finger for example), with the exception that the magnetic core 130 has a gap 131 (a break, a cut, an opening) in one side in which the sensor 140 can sense the field of the core 130.

The shape of the magnetic core 130, when viewed in cross-section, may be described as being roughly "C" shaped, due to the gap 131, as illustrated in FIG. 1B. However, aside from needing to encircle the wires 120 (or terminals 110) with a gap 131 for the sensor 140, the precise shape of the core 130 is not necessarily limited in any way. For example, the magnetic core 130 may have the shape of a rectangular annulus (excluding the gap 131) when viewed from a front of the connector 100 or in cross-section, as illustrated in FIGS. 3A, 5A, 7A, and 8A. As another example (not illustrated), the magnetic core 130 could also have the shape of a circular annulus, an oblong elliptical annulus, an irregular annulus, etc.

The length of the magnetic core 130 in the direction that the wires 120 run (denoted "x" in FIG. 3B) is not limited, but in some examples may be equal to or larger than the length of a sensing portion of the sensor 140 in the same direction. The thickness of the magnetic core (denoted "y" in FIG. 3B) is not limited, but in some examples may be equal to or larger than the width of the sensing portion of the sensor 140 in the same direction. In other words, in some examples, a cross-sectional area of the core 130 is equal to or larger than an area of a sensing portion of the sensor 140. In some examples, the sensing portion of the sensor 140 may be around 1 mm×1 mm in area, and the core 130 is more than 1 mm long ("x" in FIG. 3B) and more than 1 mm thick ("y" in FIG. 3B).

The magnetic core 130 is formed from a magnetic material, such as ferrite, iron, nickel, alnico, cobalt, carbon steel, etc. In some examples, a material with relatively high magnetic permeability and relatively low coercivity may be used, such as soft iron or soft ferrite.

The Hall-effect sensor 140 is a sensor that is capable of sensing the magnitude of a magnetic field around the sensor 140. For example, the Hall-effect sensor 140 may include a strip of conductive material (e.g., a metal like copper) and may be configured to flow a current along the strip in one direction, measure a voltage gradient across the strip in a second direction perpendicular to the current flow (the magnitude of the voltage gradient being indicative of the magnitude of the magnetic field), and output a signal based on the voltage gradient. The signal output by the sensor 140 ("SIG") may be an analog or digital signal, and may be indicative of the magnitude of the magnetic field (or may be a binary value indicative of whether or not the magnitude of the magnetic field exceeds a threshold value). The Hall-effect sensor 140 may be disposed within the gap region of the magnetic core 130, and as a result the sensor 140 may sense the magnetic field (if any) within the core 130—more specifically, the sensor 140 senses the magnetic field within the gap, but because the magnetic field in the gap is dependent on the magnetic field within the core 130, then field in the gap may be used as a proxy for the field within the magnetic core 130. Thus, when it is said herein that the sensor 140 is configured to sense a magnetic field induced in the core 130, this should be understood to mean that the sensor 140 is placed in the gap 131 in close proximity to the core 130 so as to sense the field in the gap 131. In some examples, the output signal SIG of the sensor 140 may be provided to fault detection logic that monitors for faults based on the signal.

The sensor 140 may receive power to operate in a variety of ways. For example, the sensor 140 may receive power from a device that the connector 100 is directly connected to, such as a load device (see, for example, FIGS. 2-3) or a power supply device. As another example, the sensor 140 may receive power from the wires 120 if they are supplying power that is compatible with the needs of the sensor 140 (see, for example, FIG. 4). These examples are discussed in greater detail below.

The wires 120 of the connector 100 include supply wires 121 that supply current to a load, and return wires 121 that return current from the load. In some examples (see FIG. 2A), the connector 100 may be part of an electrical cable assembly, in which case the wires 120 may extend from a cable portion of the electrical cable into the overmold 150. In some examples (see FIG. 6A), the connector 100 may be attached to a PCB, in which case the wires 120 may be wires of the PCB or electrically connected to wires of the PCB. In some examples (not illustrated), the connector 100 may be integrally part of a PCB (such as a board edge connector), in which case the wires 120 may be wires (e.g., conductive traces) of the PCB.

The terminals 110 may include any types of terminals that can provide conductive connection points for establishing electrical connections with complementary terminals when the connector 100 mates with a complementary connector. Examples of various types of terminals that could be used as the terminals 110 include pins, sockets, exposed conductive traces on a PCB ("gold-fingers"), etc. For example, the connector 100 may be a so-called "male"-type connector or "plug", with the terminals 110 being primarily pins that are to be plugged into complementary sockets of another electrical connector (see for example FIGS. 2A-3B). As another example, the connector 100 may be a so-called "female"-type connector or "receptacle", with the terminals 110 being primarily sockets that are to receive complementary pins of another electrical connector (see for example FIGS. 6A-6B). In other examples (not illustrated), pin-type terminals 110 and socket-type terminals 110 may be mixed in the same connector 100.

A terminal 110 that terminates a supply wire 121 may be referred to herein as a supply terminal 111, and a terminal that terminates a return wire 122 may be referred to herein as a return terminal 112. In some examples, some of the terminals 110 may provide functionality for the sensor 140, and these terminals 110 may also be referred to as terminals 113, 114, and 115 when it is desired to distinguish them from other terminals 110 (described in greater detail below in relation to FIGS. 2B, 4B, and 5B).

The wires 120 and terminals 110 may be arranged in any way that is desired. In particular, although the examples illustrated in FIGS. 2-8 show the wires 120 and terminals 110 arranged in rows with uniform spacing, these are not limiting examples and there is no requirement that the wires 120 be arranged in rows with uniform spacing, or that the wires be arranged in any orderly manner. The minimum distances between the core 130 and the wires 120 (or terminals 110) are not limited, but in some examples may be between about 2 mm and 4 mm.

Various example implementations of the connector 100 will be described below with reference to FIGS. 2-8. The examples are selected to highlight certain features and variations, but are not intended to be exhaustive or limiting. In particular, each of the features highlighted in the examples below could be combined with others of the features in any manner, except where logically or physically impossible. In other words, example implementations of the connector 100 described herein include any and all possible combinations and permutations of the features described herein.

1.1 Example of FIGS. 2A-3B

FIGS. 2A-3B illustrate an example in which the connector 100 is part of an electrical cable assembly, and thus is connected to an end of a cable portion 210. However, this is merely an example and features of the connector 100 illustrated in this example could also be used in other contexts.

Figure 2A:
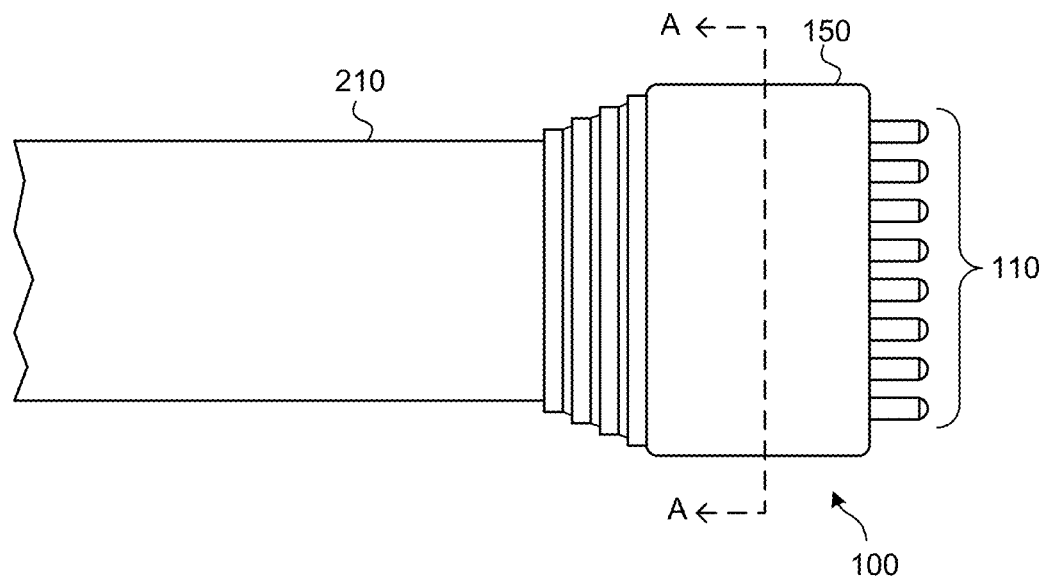
FIG. 2A illustrates an example of a smart electrical connector in the context of an electrical cable.
Figure 2B:
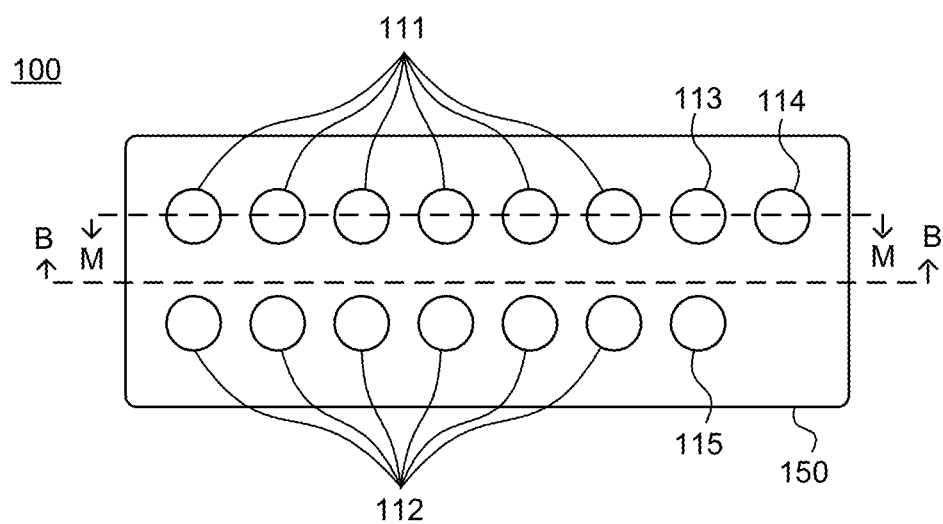
FIG. 2B illustrates a front view of the example smart electrical connector of FIG. 2A.
Figure 3A:
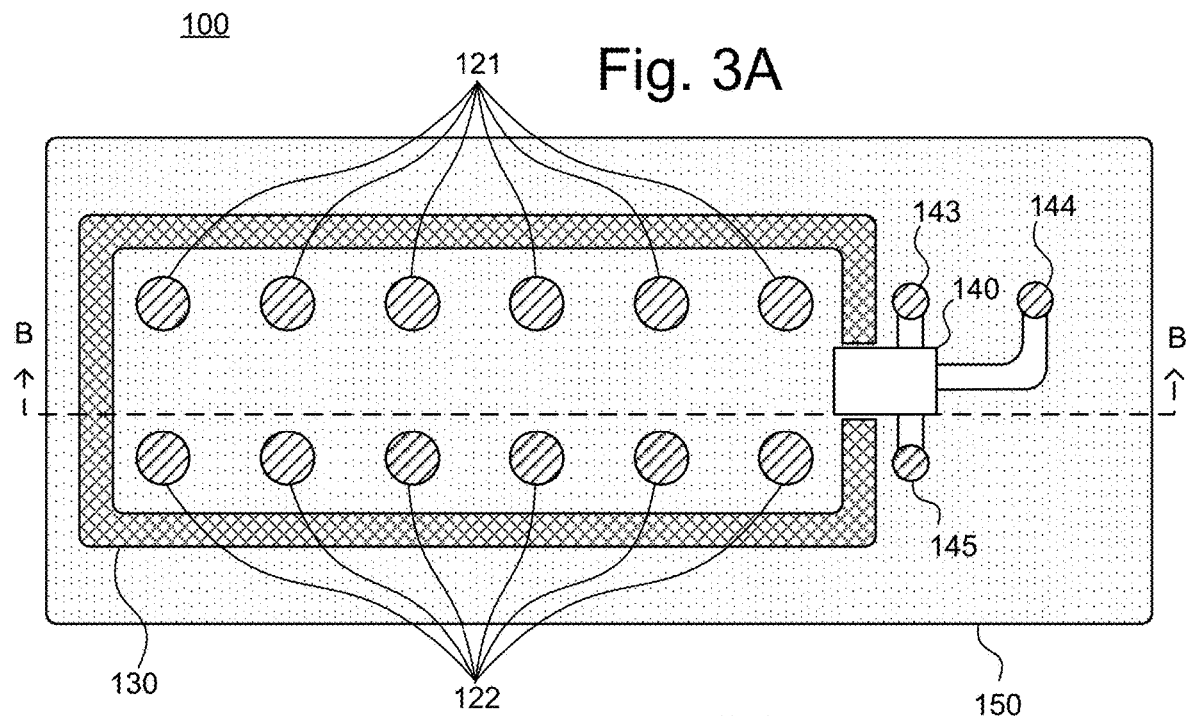
FIG. 3A illustrates a cross-sectional view of the smart electrical connector of FIG. 2A, with the section being taken along the line A-A.
Figure 3B:
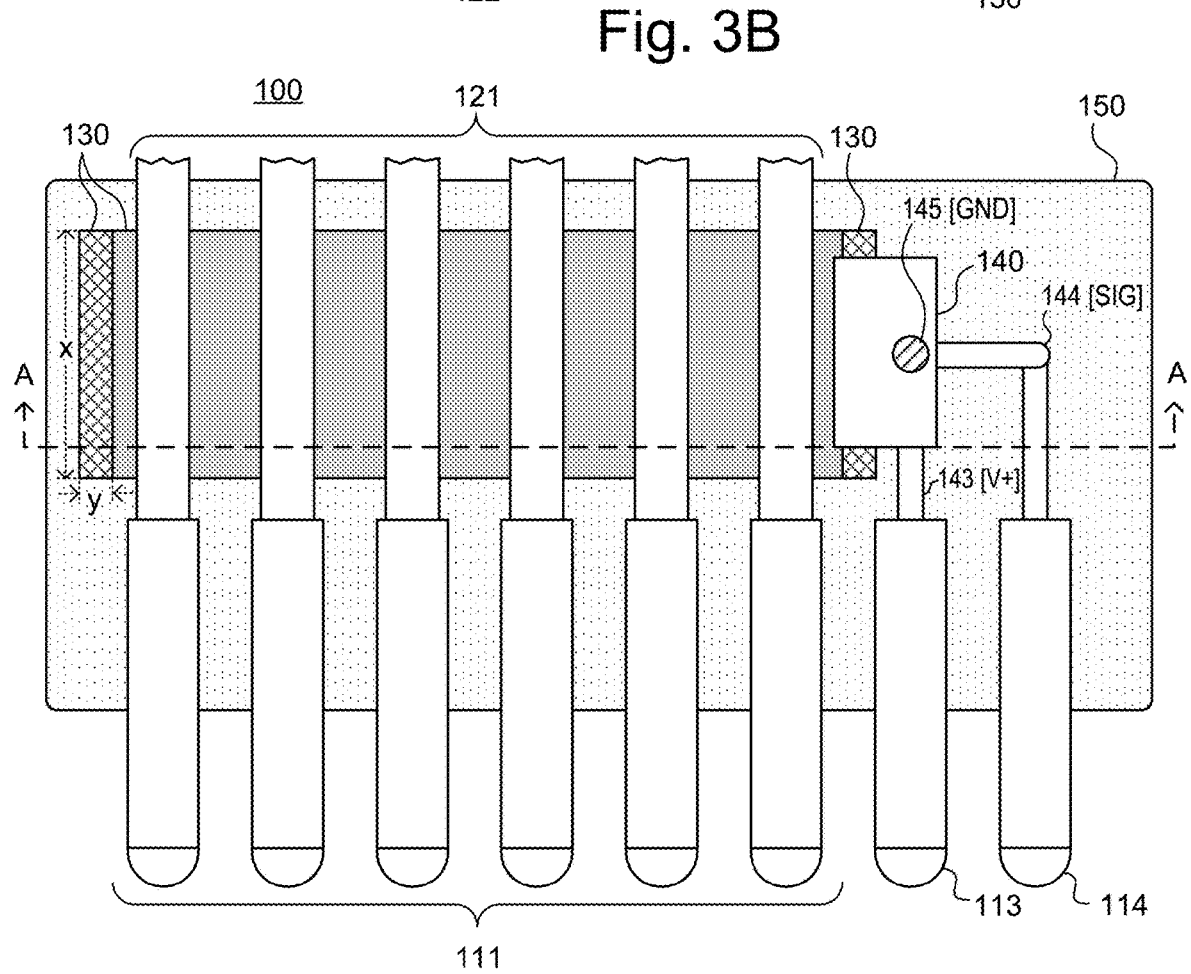
FIG. 3B illustrates a cross-sectional view of the smart electrical connector of FIG. 2A, with the section being taken along the line B-B.

One distinguishing feature of the example of FIGS. 2-3 is that the sensor 140 receives power from the device to which the connector 100 is connected via terminals 113 and 115, and the output signal SIG is output via a terminal 114. As shown in FIGS. 3A and 3B, the wires 143, 144, and 145 connect the sensor 140 to the terminals 113, 114, and 115, respectively. In this example, the wires 143, 144, and 145 are not encircled by the magnetic core 130.

The wire 143 is to supply a power signal V+ to the sensor 140, which is received via the terminal 113 from the device that the connector 100 is connected to. The wire 145 is to supply a power signal GND to the sensor 140, which is received via the terminal 115 from the device that the connector 100 is connected to. In some examples, V+ and GND may be derived from electrical signals supplied to the device by the connector 100, for example via a power converter on the device. One reason that it may be beneficial to provide power to the sensor 140 in this seemingly roundabout manner (rather than obtaining power directly from the wires 120) is that the power needs of the sensor 140 might not match the characteristics of the electrical signals carried by the wires 120. For example, the wires 120 might supply 12V DC power signals, while the sensor 140 may require 3V DC power. In other examples, V+ and GND may be generated by the device without deriving them from signals received on the wires 120, such as when the device is the power source (rather than the load).

In this example, the terminals 110 are pins, which are configured to plug into complementary sockets of another connector. The ends of the wires 120 are inserted into openings in the rear or the terminals 110, and make physical contact with the terminals 120, thereby establishing electrical connections between the wires 120 and the terminals 110. The wires 120 may be secured to the terminals 110 by any means (e.g., crimping the terminals, solder, adhesive, mechanical fasteners etc.). The terminals 113, 114, and 115 are illustrated in FIG. 2B as being the same in size and shape as the other terminals 110, but this need not necessarily be the case. In particular, in some examples, the electrical signals conveyed via the terminals 113, 114, and 115 may not require as heavy a gauge of wiring, and thus the terminals 113, 114, and 115 may have a smaller form factor than the other terminals 110.

As shown in FIG. 3A, in this example the magnetic core 130 is roughly shaped (viewed in cross section) as a rectangular annulus with a gap in one side, and the wires 120 are arranged within the core 130 in two rows of six. In this example, the locations of the wires 120 within the core 130 are aligned with the locations of the terminals 110, and the wires 120 have approximately the same minimum distance to the core 130. In this example, the supply wires 121 are in one row and the return wires 122 are in the other row, but this is not necessary and in other examples they could be arranged differently. Moreover, the numbers and arrangements of terminals 110 shown in FIGS. 2-3 are merely examples for illustration, but in practice any number of terminals may be included in the connector 100 in any arrangement as long as there is at least one supply terminal 111 and one return terminal 112. Moreover, the number of supply terminals 111 does not necessarily have to match the number of return terminals 112, and number of supply wires 121 does not necessarily have to match the number of return wires 122.

FIGS. 2-3 are illustrated primarily to show an example of the features of connecting the power inputs and/or signal output of the sensor 140 to terminals 110, but this feature is not limited to the particular context illustrated in the figure. In particular, any example connector 100 described herein could implement the features of connecting the power inputs and/or signal output of the sensor 140 to terminals 110.

1.2 Example of FIGS. 4A-4C

The example of FIGS. 4A-4C is similar to the example of FIGS. 2A-3B in many respects, and duplicative description of the similar features is omitted. The primary distinguishing feature of the example of FIGS. 4A-4C is that in this example the sensor 140 obtains power directly from the wires 120, rather than from the device that the connector 100 is connected to.

As shown in FIG. 4C, the wire 143 that supplies the power signal V+ to the sensor 140 is electrically connected to one of the supply wires 121, rather than to a terminal 113 as in FIG. 3B. The wire 143 may be connected to the wire 121 by, for example, solder 101. Although not visible in the figures, the wire 145 that supplies the power signal GND to the sensor 140 is electrically connected to one of the return wires 122, in a similar manner as the wire 143 is connected to the wire 121. Obtaining V+ and GND directly from the wires 120, as in this example, may be beneficial when the wires 120 carry power signals that are compatible with the power needs of the sensor 140.

In this example, the signal SIG is still output using a terminal 114, but in other examples this is not necessarily the case.

An advantage of this example compared to the previous example is that two terminals 110 may be eliminated from the connector 100, which may enable the connector to be made smaller. However, a possible disadvantage of this example is that the connector 100 needs to carry a power signal that is compatible with the sensor 140, thus potentially reducing the number of suitable use cases for the connector 100.

FIG. 4 is illustrated primarily to show an example of the feature of powering the sensor 140 by connecting it to the wires 120, but this feature is not limited to the particular context illustrated in the figure. In particular, any example connector 100 described herein could implement the feature of powering the sensor 140 by connecting it to the wires 120.

Figure 5A:
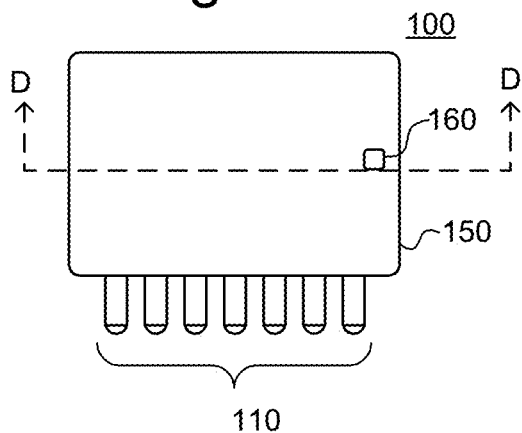
FIG. 5A illustrates a modified version of the example smart electrical connector of FIG. 2A, which includes an indicator light.
Figure 5B:
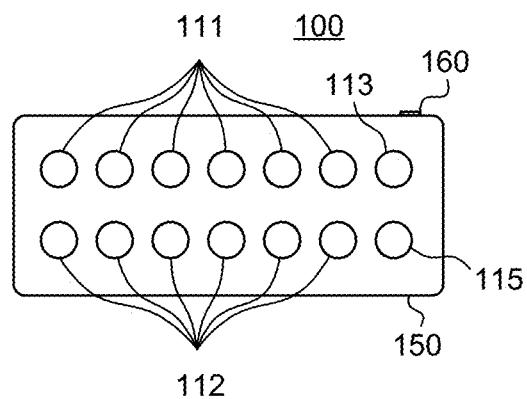
FIG. 5B illustrates a front view of the smart electrical connector of FIG. 5A.
Figure 5C:
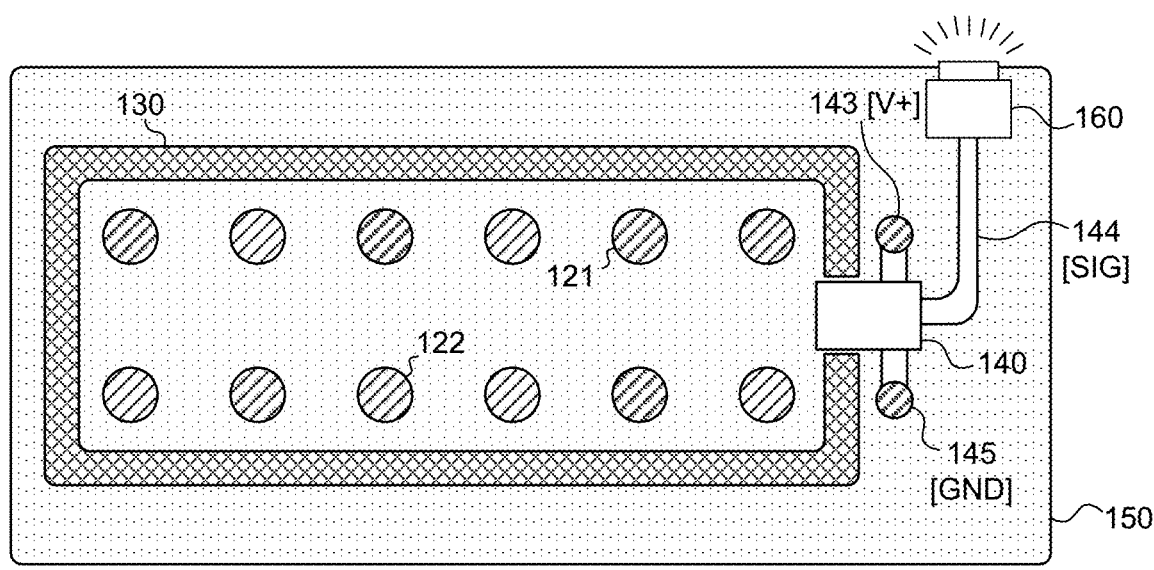
FIG. 5C illustrates a cross-sectional view of the smart electrical connector of FIG. 5A, with the section being taken along the line D-D.

1.3 Example of FIGS. 5A-5C

The example of FIGS. 5A-5C is similar to the example of FIGS. 2A-3B and the example of FIGS. 4A-4C in many respects, and duplicative description of the similar features is omitted. The primary distinguishing feature of the example of FIGS. 4A-4C is that in this example the connector 100 includes a visual and/or audible indicator 160 (e.g., a light) to signal to a user whether a fault has occurred, and the output signal SIG of the sensor 140 is used to control whether the indicator 160 signals a fault. This use of SIG to control an indicator 160 may be done in addition to, or in lieu of, sending the signal SIG to fault detection logic of a device for fault monitoring.

For example, in FIG. 5, the indicator 160 is a light emitting device, such as an LED, and the output signal SIG is provided to the indicator 160 via the wire 144. When SIG has a particular value or exceeds a threshold, the indicator 160 generates visual alert to indicate a fault. The visual alert to indicate a fault could include anything that is visually distinguishable from what the indicator 160 does when there is no fault, such as, for example: beginning to emitting light (when no light is emitted for a no fault state), emitting light of a specific color (when light of a different color is emitted for a no fault state), ceasing to emit light (when light is emitted for a no-fault state), flashing light (when the light is steady off or steady on in a no-fault state), etc.

The light emitting device 160 may include, for example, an LED to emit light, and logic to generate the visual alert based on SIG. In some examples, SIG is essentially a binary value, with one value (e.g., high) indicating a fault and the other value (e.g., low) indicating no fault. In such examples, the logic may simply trigger the alert based on which value SIG has. In other examples, SIG may take on arbitrary values, in which case the logic may include a comparator to compare SIG to a threshold value and trigger the alert when SIG exceeds the threshold.

The light emitting device 160 may obtain power in any of the ways described herein relation to powering the sensor 140 (e.g., from the wires 120 or from the device the connector 100 is supplying current to).

FIG. 5 is illustrated to show an example of the feature of providing a visual indicator, but this feature is not limited to the particular context illustrated in the figure. In particular, any example connector 100 described herein could implement the feature of providing a visual indicator.

Figure 6A:
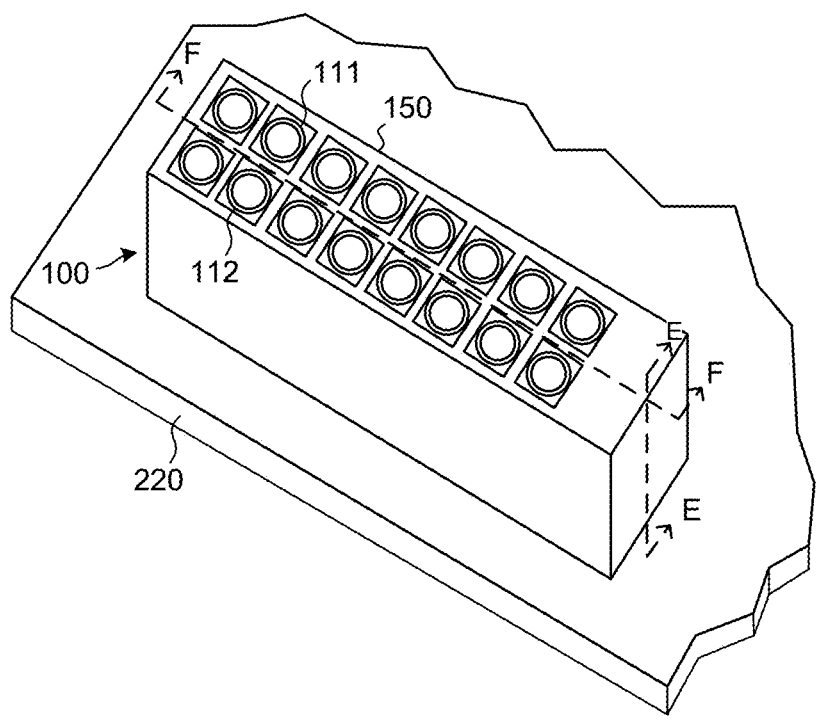
FIG. 6A illustrates an example of a smart electrical connector in the context of a printed circuit board.
Figure 6B:
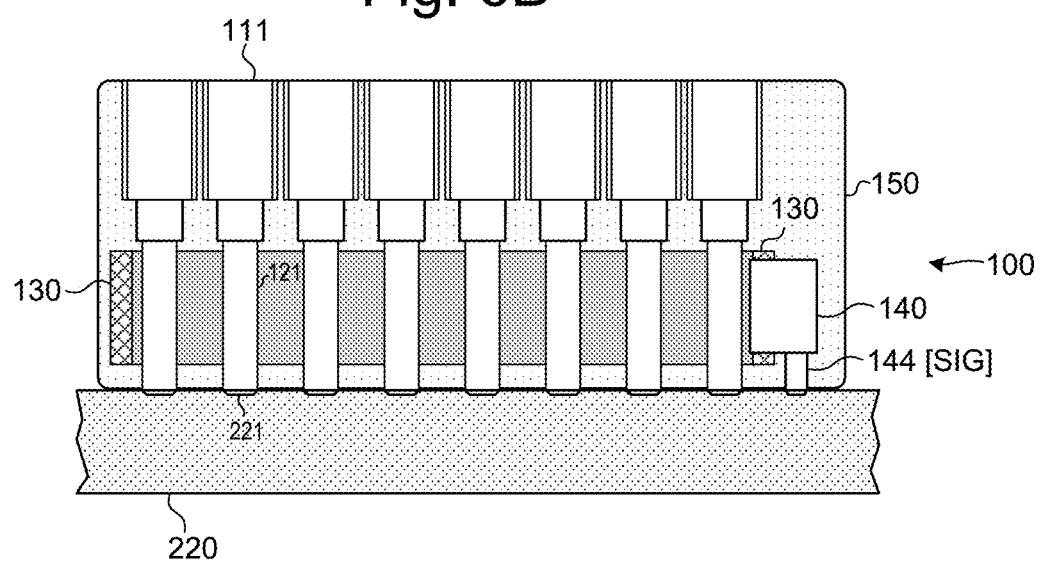
FIG. 6B illustrates a cross-sectional view of the smart electrical connector of FIG. 6A, with the section being taken along the plane defined by the lines E-E and F-F.

1.4 Example of FIGS. 6A-6B

The example of FIGS. 6A-6B is similar to the example of FIGS. 2A-3B and the example of FIGS. 4A-4C in many respects, and duplicative description of the similar features is omitted. However, in this example, the connector 100 is implemented in the context of being attached to a PCB 220.

The PCB 220 may be part of a device, such as a load device (e.g., server) or a source device (e.g., power supply unit), in which case the connector 100 is a connector of the device. Specifically, in some examples, a computing device (e.g., server) includes a PCB 220 and one or more smart connectors 100 attached to the PCB 220 to receive power and/or signals from some other device (such as a power supply unit) for the PCB 220. In other examples, a power supply device includes a PCB 220 and one or more smart connectors 100 attached to the PCB 220 to supply power and/or signals from the PCB 220 to some other device.

The PCB 220 may alternatively be part of an intermediary to connect two devices together, such as a backplane or midplane. Specifically, in some examples a computing system (such as a multi-node chassis) may include a backplane or a midplane comprising a PCB 220 and one or more smart connectors 100 attached to the PCB 220, the connectors 100 to connect computing devices installed in the computing system to one another and/or to a power source.

In the example of FIG. 6, the connector 100 is shown as "female" type receptacle, with the terminals 110 being sockets rather than pins. The sockets include openings to receive complementary pins of another connector that is plugged into the connector 100. However, it should be understood that a "male" type (or other type) of connector could also be used in the context of a connector of a PCB 220.

In FIG. 6B, the output signal SIG is provided to the PCB 220 via the wire 144, which is connected to a conducive trace 221 of the PCB 220. From there, SIG may be conveyed to fault detection logic on the PCB 220. In this example, no terminal 110 is needed to provide SIG to the fault detection logic, since the connector 100 is directly connected to the PCB 220. Similarly, in this example the sensor 140 may obtain power from the PCB 220 via wires 143 and 145 (not illustrated), which are connected directly to traces 221 of the PCB 220, rather than via terminals 110.

FIG. 6 is illustrated to show an example in which the connector 100 is attached to a PCB 220, but it should be understood that the specific connector 100 show in the figure is not the only one that can be connected to a PCB 220. In particular, any example connector 100 described herein could be implemented as a PCB 220 connector.

Figure 7A:
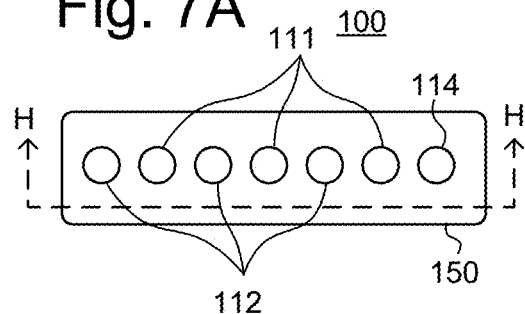
FIG. 7A illustrates an example of a smart electrical connector.
Figure 7B:
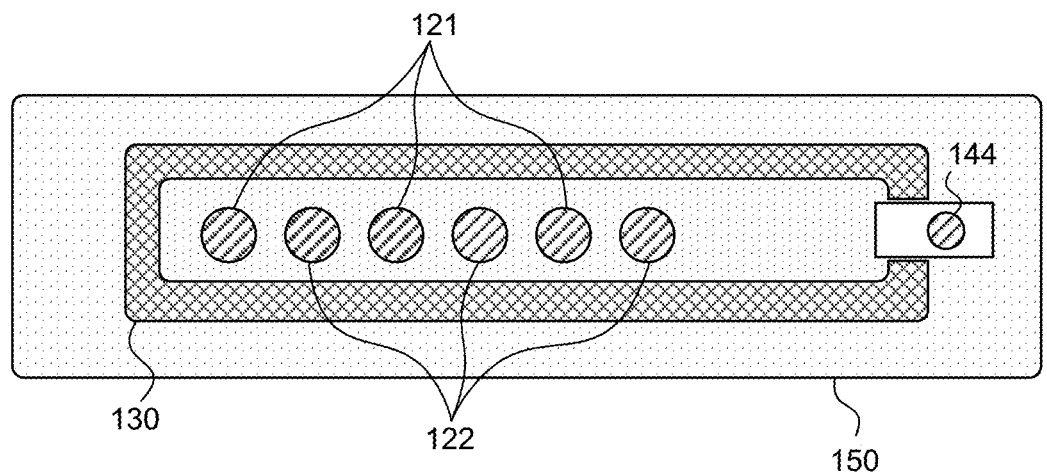
FIG. 7B illustrates a cross-sectional view of the smart electrical connector of FIG. 7A, with the section being taken along the line G-G.
Figure 7C:
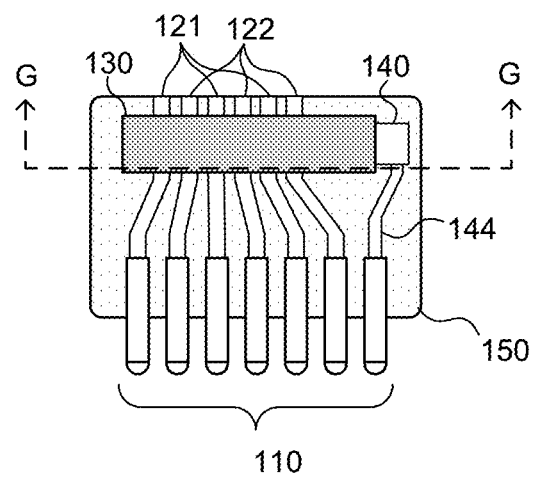
FIG. 7C illustrates a cross-sectional view of the smart electrical connector of FIG. 7A, with the section being taken along the line H-H.

1.5 Example of FIGS. 7A-7C

The example of FIGS. 7A-7C is similar to the example of FIGS. 2A-3B in many respects, and duplicative description of the similar features is omitted. However, in the example of FIG. 7, the supply wires 121 and the return wires 120 are arranged in a single row of six, with supply and return alternating.

In this example, the locations of the wires 120 within the core 130 are not aligned with the locations of the terminals 110. In particular, in this example, the wires 120 are grouped more closely together than the terminals 110, and are congregated more on one side of the magnetic core 130. This may be done, for example, in order to increase the distance between the sensor 140 and the closest wire 120 to it. Increasing this distance may help to reduce a possible source of error, in which the wire closest to the sensor 140 may unduly influence the sensor 140. In particular, when the supply and return currents are balanced, on the whole the total magnetic field in the magnetic core 130 should be approximately zero, as the fields induced by the supply wires 121 are canceled out by the fields induced by the return wires 121. However, outside of the core 130 the magnetic field is not going to necessarily be fully canceled out at every point, as the wire 120 that is closest to a given point is going to exert a stronger influence at that point than the other wires 120, and thus its field is not going to be fully canceled out. Thus, in some examples, the wire that is closest to the gap 131 may cause a small but non-zero field to appear in the gap 131, even when the field within the core 130 is zero, which could cause the sensor 140 to trigger a false-positive fault detection. However, by moving the wires 120 further away from the sensor 140, the strength of the fields they produce at the gap 131 are greatly decreased, reducing the chances of such a false positive.

Another way to reduce the influence of the wires 120 on the sensor 140 is to position a supply wire 121 and a return wire 120 equidistant to the sensor 140, as in the example of FIG. 3A. However, this approach may not work in some examples in which there is only one row of wires 120.

FIG. 7 is illustrated to show an example of the feature of grouping the wires 120 to one side to increase the distance from the sensor 140 to the closes wire 120, but this feature is not limited to the particular context illustrated in the figure. In particular, any example described herein could implement the feature of grouping the wires 120 away from the sensor 140.

Figure 8A:
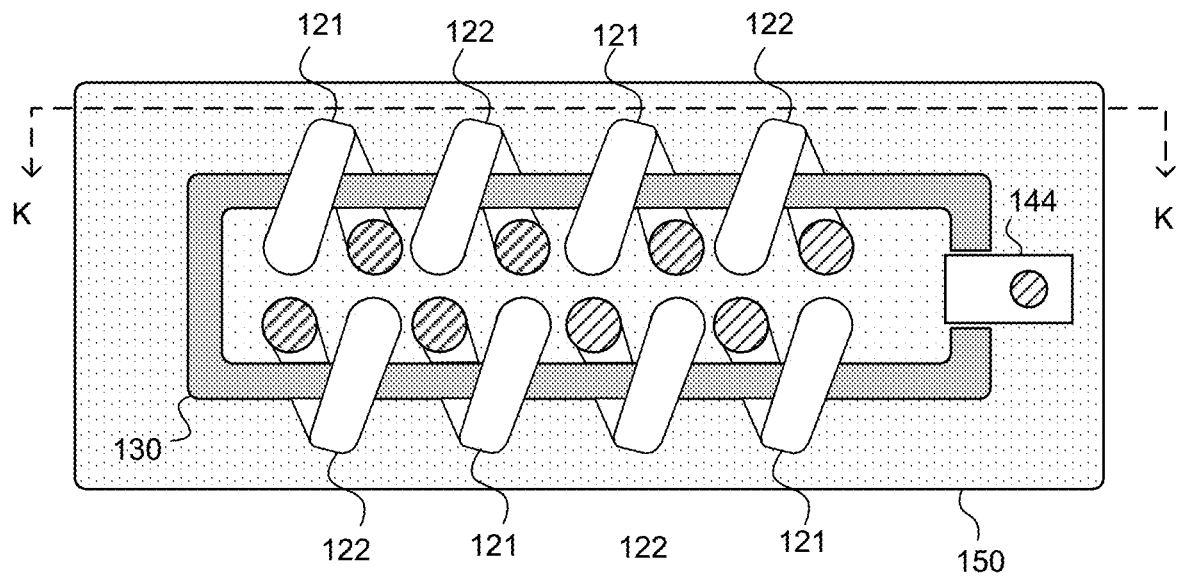
FIG. 8A illustrates a cross-sectional view of a smart electrical connector, with the section being taken down the line J-J.
Figure 8B:
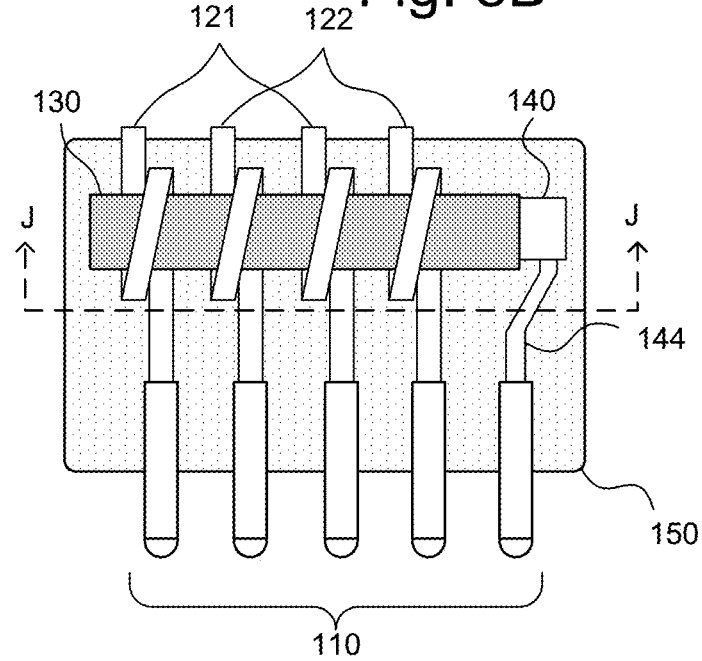
FIG. 8B illustrates a cross-sectional view of the smart electrical connector of FIG. 8A, with the section being taken along the line K-K.

1.6 Example of FIG. 8A-8B

The example of FIGS. 8A-8B is similar to the example of FIGS. 4A-4C in many respects, and duplicative description of the similar features is omitted.

However, in the example of FIG. 8, the wires 120 are each wrapped around one side of the core 130, rather than merely passing through the center opening of the core 130. The wrapping of the wires 120 around a side of the core 130 increases the strength of the fields they induce in the core 130. This may make it easier for the sensor 140 to detect faults in which only a small amount of current is straying from the designated path.

In particular, if only a small amount of current is bypassing the connector 100, then the total magnetic field induced in the magnetic core will be fairly small. Thus, either: (A) the threshold that is used to detect faults will need to be made very low in order to detect such small deviations, resulting in more false-positives as the threshold gets closer to a noise floor, or (B) the threshold may be kept higher to avoid false positives, resulting in more false-negatives (i.e., such faults are being detected). However, if the strength of the field induced by each wire 120 is increased by wrapping the wires 120, this also increases the size of a field that a small current imbalance will generate, making such a fault detectable without lowering the comparison threshold.

In the example of FIG. 8, each wire 120 is wrapped once around a side of the core 130, but this is merely an example, and any number wrappings may be used. Generally, it may be desirable to ensure that each wire 120 is wrapped the same number of times around the core 130 as the other wires.

FIG. 8 is illustrated to show one example of how the wires 120 could be wrapped around the core 130, but this feature is not limited to the context illustrated in the figure. In particular, any example described herein could implement wrapping of the wires 120 around the core 130.

2. Example Device

Figure 9:
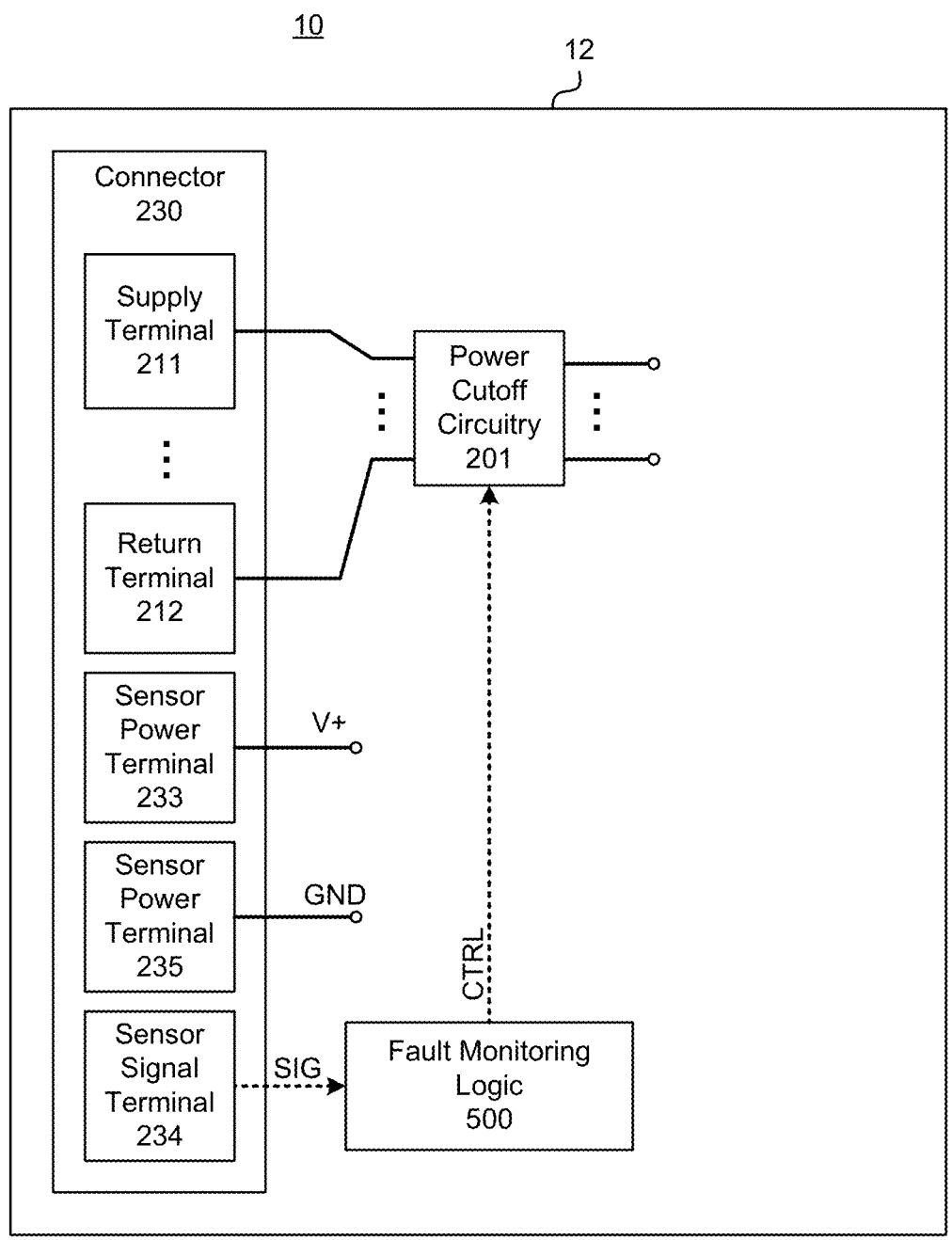
FIG. 9 is a block diagram illustrating conceptually an example electrical device.
Figure 10:
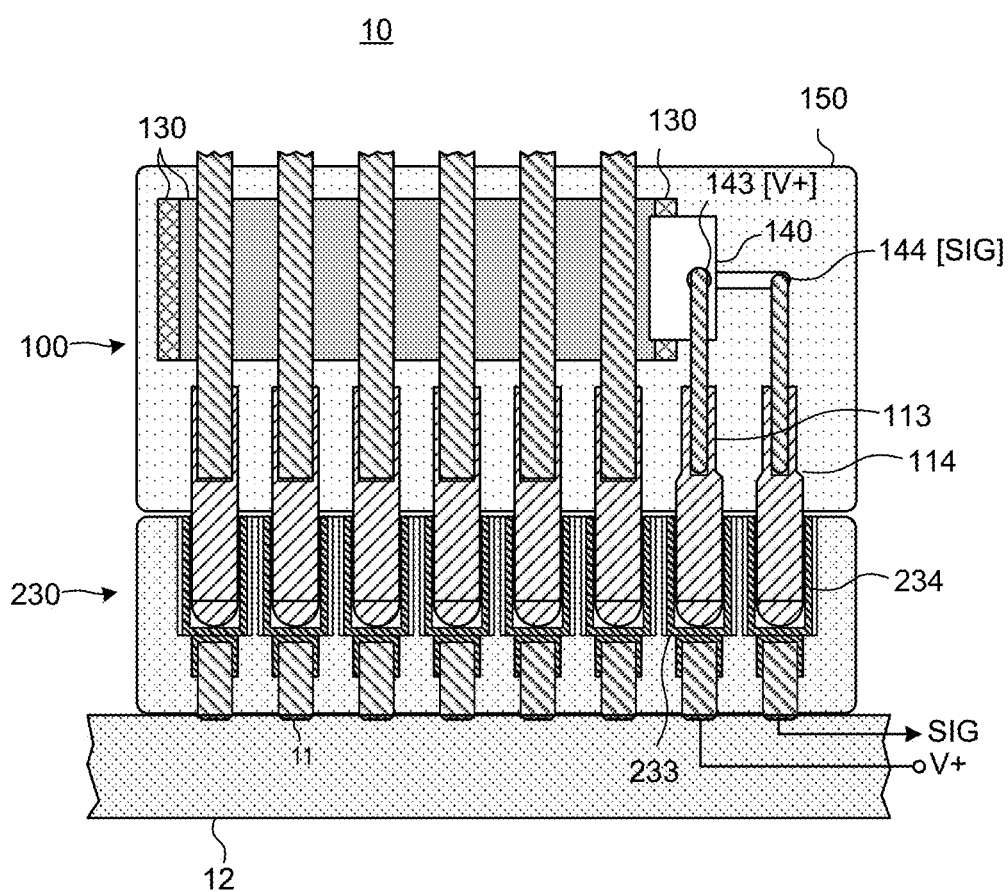
FIG. 10 illustrates a cross-sectional view of an electrical connector of the example electrical device of FIG. 9 with the example smart electrical connector of FIG. 2A-3B plugged therein, with the section being taken along the line M-M.

FIG. 9 illustrates an example device 10 that includes a PCB 12 with a connector 230 that is designed to be used in conjunction with the connector 100. In some examples, the device 10 includes the connector 100, with the connector 100 plugged into the connector 230—for example, FIG. 10 illustrates an example in which the connector 100 of FIGS. 2-3 is connected to the connector 230. In other examples, the connector 100 is not yet plugged into the device 10. The device 10 may be a load device, such as a computing device (e.g., server), or a source device, such as a power supply unit.

The connector 230 includes a number of terminals 210 that are complimentary to the terminals 110 of the connector 100 that the connector 230 is designed to mate with. For example in FIG. 10, the terminals 210 are sockets configured to receive the pin-type terminals 110 of the connector 100 of FIGS. 2-3.

The terminals 210 include one or more supply terminals 211, one or more return terminals 212, sensor power terminals 233 and 235, and a sensor signal terminal 234.

The supply terminals 211 are arranged to mate with the supply terminals 121 of the connector 100. In examples in which the device 10 is a load device, the supply terminals 211 receive current from the connector 100 when it is connected to the connector 230, and supply that current to one or more loads (not illustrated) of the device via the power cutoff circuitry 201. In examples in which the device 10 is a source device (e.g., power supply unit), the supply terminals 211 provide current to the connector 100 when it is connected to the connector 230, the current being generated by power circuitry (not illustrated) of the device 10 and made available to the supply terminals 211 via the power cutoff circuitry 201.

The return terminals 212 are arranged to mate with the return terminals 122 of the connector 100. In examples in which the device 10 is a load device, the return terminals 212 return current from a load (not illustrated) of the device 10 to the connector 100 when it is connected to the connector 230. In examples in which the device 10 is a source device (e.g., power supply unit), the return terminals 212 receive return current from the connector 100 when it is connected to the connector 230.

The sensor power terminals 233 and 235 may provide the power signals V+ and GND to the terminals 113 and 115 of the connector 100 when it is connected to the connector 230. In examples in which the device 10 is a load device, the power signals V+ and GND may be derived from power that is received from the connector 100. For example, power received from the connector 100 may be fed into a power converter (not illustrated) of the device 10 to generate the power signals V+ and GND. In examples in which the device 10 is a source device, the power signals V+ and GND may be generated by power circuitry (not illustrated) of the device 10.

The sensor signal terminal 234 is to receive the output signal SIG from the sensor 140 of the connector 100 via the terminal 114. The sensor signal terminal 234 may provide the signal SIG to fault monitoring logic 500.

The fault monitoring logic 500 may monitor for faults based on the SIG. In particular, in examples in which SIG is a binary valued signal, the fault monitoring logic may determine there is a fault when SIG takes a first value and may determine that there is no fault when SIG takes a second value. In examples in which SIG may take arbitrary values, the fault monitoring logic 500 may determine that there is a fault when SIG is in a first range of values (e.g., when the absolute value of SIG exceeds a threshold value), and may determine that there is a no fault when SIG is in a second range of value (e.g., when the absolute value of SIG is less than the threshold value).

When the fault monitoring logic 500 determines that a fault is present, it may take some action, such as enacting protective countermeasures and/or generating an alert for a user. An example of a countermeasure that the fault monitoring logic 500 may employ is cutting off the flow of power through the connector 230. This may be done, for example, by sending a control signal CTRL to power cutoff circuitry 201, which cases the power cutoff circuitry 201 to cut off the flow of power through the connector 230. The power cutoff circuitry 201 may include one or more switches (e.g., power MOSFETs), eFuses, or the like that are controlled by the control signal CTRL. In some examples, the fault monitoring logic 500 may initiate a graceful shutdown of loads on the device 10 prior to cutting off power.

Responsive to identifying a fault, the fault monitoring logic 500 may also notify another device (such as a power supply unit, chassis controller, system controller, IT management entity, etc.) of the fault, and the other device may employ countermeasures in addition to or in lieu of the logic 500 employing countermeasures.

The fault monitoring logic 500 may generate an alert for a user, in addition to or in lieu of enacting countermeasures. The alert could include, for example, an electronic communication, displayed text on a display device, or other perceptible signal such as a light or audible alert.

Figure 11:
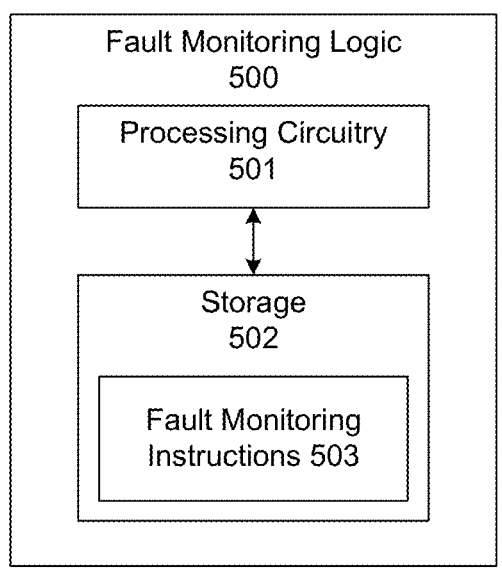
FIG. 11 is a block diagram illustrating conceptually example fault monitoring logic.

FIG. 11 illustrates an example of the fault monitoring logic 500. The fault monitoring logic 500 includes processing circuitry 501 that is configured to the perform operations described herein for fault monitoring. The processing circuitry 501 includes a number of processors that are configured to perform one or more operations described herein, dedicated hardware that is configured to perform one or more operations described herein, or any combination of these. When the processing circuitry includes a processor, it may also include storage 502 storing fault monitoring instructions 503 that may be executed by the processor.

Thus, when it is said herein that the fault monitoring logic 500 is configured to perform an operation, this means that either (a) there is an instruction stored in the storage 502 that, when executed by a processor of the processing circuitry 501, will cause the processing circuitry 501 to perform the operation, (b) there is detected hardware in the processing circuitry 501 that is configured to perform the operation, or (c) some combination of (a) and (b).

As used herein, a "processor" may include (or be virtualized from) any circuitry that is capable of executing machine-readable instructions, such as central processing units (CPUs), graphic processing units (GPUs), a system-on-chip (SoC), microprocessors, microcontrollers, digital signal processors (DSPs), application-specific instruction set processors (ASIPs), etc. As used herein, "dedicated hardware" means any physical device or component that is configured to perform a specific operation or set of operations (although not necessarily dependent on executing instructions), such as application-specific integrated circuits (ASICs), complex programmable logic devices (CPLD), field-programmable gate arrays (FPGAs), and so on. There is not necessarily a sharp line between processor and dedicated hardware, and some devices (such as FPGAs) could arguably fall under either category.

The storage 502 may include any non-transitory machine readable medium, which may include volatile storage media (e.g., DRAM, SRAM, etc.) and/or non-volatile storage media (e.g., PROM, EPROM, EEPROM, NVRAM, flash, hard drives, optical disks, etc.).

The fault monitoring instructions 503 may include instructions to perform any of the operations described above in relation to the logic 500, and/or any of the operations described below in relation to the process 1000.

3. Example Fault Monitoring Process 1000

Figure 12:
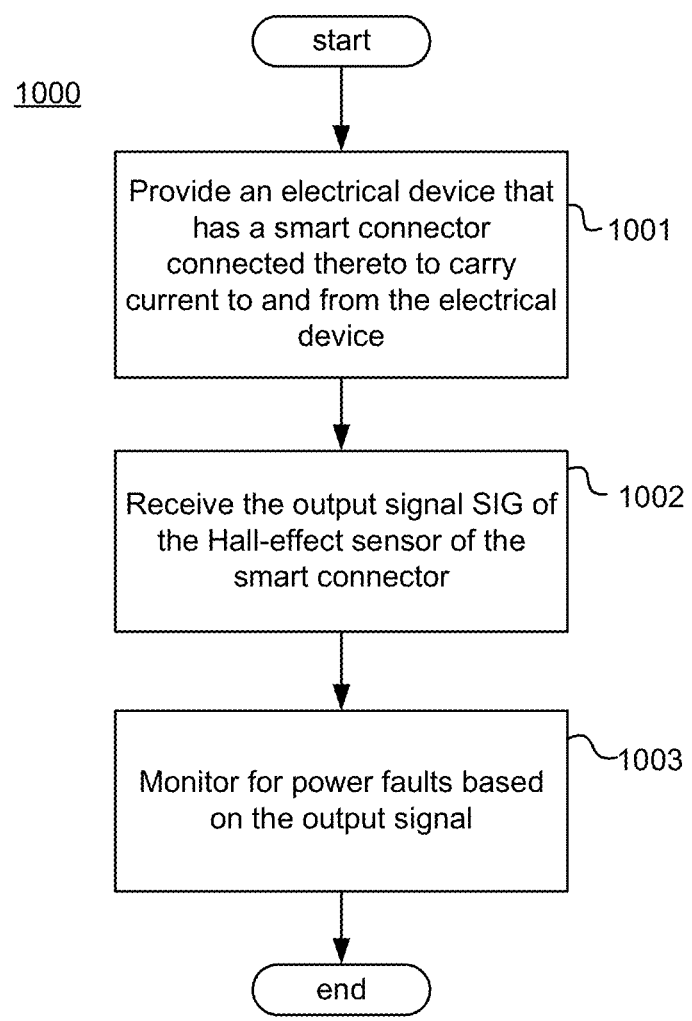
FIG. 12 is a process flow chart illustrating an example method.

FIG. 12 illustrates an example method for detecting faults. The method may be performed, in part, by a processor of fault detection logic of the device, such as the fault detection logic 500 described above.

At block 1001, an electrical device with a smart electrical connector connected thereto is provided. The electrical device having a smart connector connected thereto means that the smart connector is either (A) a part of the device (e.g., attached to a PCB of the device), or (B) a connector of an intermediary, such as a cable assembly or backplane, that is mated with a connector of the device. The smart electrical connector is one of the example connectors described herein that includes a magnetic core and sensor, such as the connector 100, and carries supply current and return current to and from the electrical device. The electrical device may be a load device, such as a computing device (e.g., server), or a source device, such as a power supply unit.

At block 1002, fault detection logic of the device receives an output signal SIG of the Hall-effect sensor.

At block 1003, fault detection logic of the device monitors for faults based on the signal SIG. In particular, the fault detection logic may compare SIG to a threshold, and detect a fault responsive to SIG exceeding the threshold. Upon detecting a fault, the fault detection logic may enact countermeasures and/or generate alerts, such as those described above.

4. Definitions

As used herein, a "processor" may include any logic circuitry that is capable of executing machine readable instructions stored in a non-transitory machine-readable medium. For example, a "processor" may be, for example, a central processing unit (CPU), a microprocessor, a microcontroller, a digital signal processor (DSP), a graphic processing unit (GPU), etc.

Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of processors, wherein the processors . . . " could encompass both one processor and multiple processors, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form for grammatical consistency, but this does not necessarily mean that only one item is being referred to. Thus, for example, a phrase such as "a processor, wherein the processor . . . " could encompass both one processor and multiple processors, notwithstanding the use of the singular form.

Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

While the above disclosure has been shown and described with reference to the foregoing examples, it should be understood that other forms, details, and implementations may be made without departing from the spirit and scope of this disclosure.

What is claimed is:

1. An apparatus comprising:
   an electrical connector that includes:
   an overmold;
   one or more supply wires embedded in the overmold;
   one or more return wires embedded in the overmold;
   one or more supply terminals embedded in the overmold and terminating the supply wires;

one or more return terminals embedded in the overmold and terminating the return wires;

a magnetic core embedded in the overmold and encircling (a) the one or more supply terminals or the one or more supply wires or both, and (b) the one or more return terminals or the one or more return wires or both; and a Hall-effect sensor embedded in the overmold and configured to sense a magnetic field of the magnetic core;

wherein the electrical connector includes wires within the overmold that electrically connect one of the one or more supply wires and one of the one or more return wires to the Hall-effect sensor to provide power to the Hall-effect sensor.

2. The apparatus of claim 1,
wherein the electrical connector includes a sensor-output terminal embedded in the overmold and configured to communicate an output signal of the Hall-effect sensor to an electrical device when the connector is connected to the electrical device.

3. The apparatus of claim 1,
wherein there is a gap in the magnetic core and the Hall-effect sensor is located in the gap.

4. The apparatus of claim 1,
wherein the electrical connector includes a visual indicator that is controlled based on an output signal of the Hall-effect sensor.

5. The apparatus of claim 1, comprising:
a cable assembly comprising a cable portion and the connector attached to one end of the cable portion, where the one or more supply wires and the one or more return wires extend out of the overmold into the cable portion.

6. The apparatus of claim 1, comprising:
a printed circuit board, the electrical connector being attached to the printed circuit board, the one or more supply wires and the one or more return wires being electrically connected to circuitry of the printed circuit board.

7. A method comprising:
providing an electrical device and the apparatus of claim 1, with the electrical connector connected to the electrical device such that the electrical connector supplies current to the electrical device;

causing processing circuitry of the electrical device to monitor the output signal of the Hall-effect sensor; and causing the processing circuitry to monitor for power faults based on the output signal.

8. The method of claim 7,
wherein causing the processing circuitry to detect power faults based on the output signal includes causing the processing circuitry to: compare the output signal to a threshold, and identify a power fault responsive to the output signal exceeding the threshold.

9. A system comprising:
an electronic device comprising processing circuitry; and
an electrical connector connected to the electronic device, comprising
an overmold;
supply wires to supply current to the electrical device and embedded in the overmold;
return wires to return current from the electrical device and embedded in the overmold
supply terminals embedded in the overmold and terminating the supply wires;
return terminals embedded in the overmold and terminating the return wires;
a magnetic core embedded in the overmold and encircling (a) the supply terminals or the supply wires or both, and (b) the return terminals or the return wires or both; and
a Hall-effect sensor embedded in the overmold and configured to sense a magnetic field induced in the magnetic core;
wherein the processing circuitry is to monitor the output signal of the Hall-effect sensor and detect power faults based on the output signal;
wherein the electrical connector includes wires within the overmold that electrically connect one of the supply wires and one of the return wires to the Hall-effect sensor to provide power to the Hall-effect sensor.

10. The system of claim 9,
wherein the electrical connector is mated with a complementary connector of the electrical device, and
the electrical connector includes a sensor-output terminal embedded in the overmold and configured to communicate an output signal of the Hall-effect sensor to the processing circuitry of the electrical device via the complementary electrical connector of the electrical device.

11. The system of claim 10,
wherein the electrical connector is part of the electrical device and is attached to a printed circuit board of the electrical device.

12. The system of claim 10,
wherein the processing circuitry is to periodically compare the output signal to a threshold, and identify a power fault responsive to the output signal exceeding the threshold.

13. The system of claim 10,
wherein the processing circuitry is to initiate protective measures responsive to identifying a power fault.

14. The system of claim 13,
wherein the protective measures include shutting down supply of power to the electronic device.

* * * * *